(12) United States Patent
Richter

(10) Patent No.: US 8,641,859 B2
(45) Date of Patent: Feb. 4, 2014

(54) BONDING METHOD

(75) Inventor: Franz Richter, Eichenau (DE)

(73) Assignee: Thin Materials AG, Eichenau (DE)

( * ) Notice: Subject to any disclaimer, the term of this patent is extended or adjusted under 35 U.S.C. 154(b) by 71 days.

(21) Appl. No.: 13/131,756

(22) PCT Filed: Nov. 30, 2009

(86) PCT No.: PCT/EP2009/066058
§ 371 (c)(1),
(2), (4) Date: Jul. 29, 2011

(87) PCT Pub. No.: WO2010/061004
PCT Pub. Date: Jun. 3, 2010

(65) Prior Publication Data
US 2011/0272092 A1    Nov. 10, 2011

(30) Foreign Application Priority Data

Nov. 28, 2008   (DE) .......................... 10 2008 044 200

(51) Int. Cl.
*B29C 65/52*   (2006.01)

(52) U.S. Cl.
USPC ........................................................ 156/286

(58) Field of Classification Search
USPC ................................................ 156/285, 286
See application file for complete search history.

(56) References Cited

U.S. PATENT DOCUMENTS

| 4,990,208 A * | 2/1991 | Kano .......................... 156/275.3 |
| 6,972,069 B2 | 12/2005 | Hecht et al. |
| 7,482,249 B2 | 1/2009 | Jakob et al. |
| 7,547,611 B2 | 6/2009 | Thallner |
| 2003/0173017 A1 * | 9/2003 | Hecht et al. .................... 156/154 |
| 2005/0221598 A1 | 10/2005 | Lu et al. |
| 2006/0292887 A1 | 12/2006 | Hara |
| 2010/0043608 A1 * | 2/2010 | Jakob .............................. 83/13 |

FOREIGN PATENT DOCUMENTS

| JP | 2008118029 | 5/2008 |
| WO | WO 2007099146 A1 * | 9/2007 |

OTHER PUBLICATIONS

G.A. Luurtsema (Jul. 11, 1997) "Spin Coating for Rectangular Substrates," Thesis: submitted to the Department of Electrical Engineering and Computer Sciences, University of California, Berkeley.
"Spin Coating Theory" (Aug. 3, 2008).

* cited by examiner

*Primary Examiner* — Daniel McNally
(74) *Attorney, Agent, or Firm* — Duane Morris LLP; J. Rodman Steele, Jr.; Gregory M. Lefkowitz

(57) ABSTRACT

The invention relates to a method for bonding a first surface (1a) and a second surface (7a) by means of an interlayer (3), comprising the steps:
a) providing a first item (1) which has the first surface (1a),
b) providing flowable, solidifiable material for the interlayer (3),
c) providing a second item (7) which has the second surface (7a),
d) applying the material for the interlayer onto the first surface (1a) so that a bulge (3a) encircling the surface is produced,
e) applying a vacuum around the first item (1) and the second item (2),
f) bringing the second surface (7a) of the second item (7) into contact with the circumferential bulge so that a sealed-off cavity (5) is produced,
g) increasing the ambient pressure so that the cavity (5) is eliminated without resulting in a stream of gas flowing into the cavity and
h) increasing the viscosity of the material for the interlayer.

14 Claims, 1 Drawing Sheet

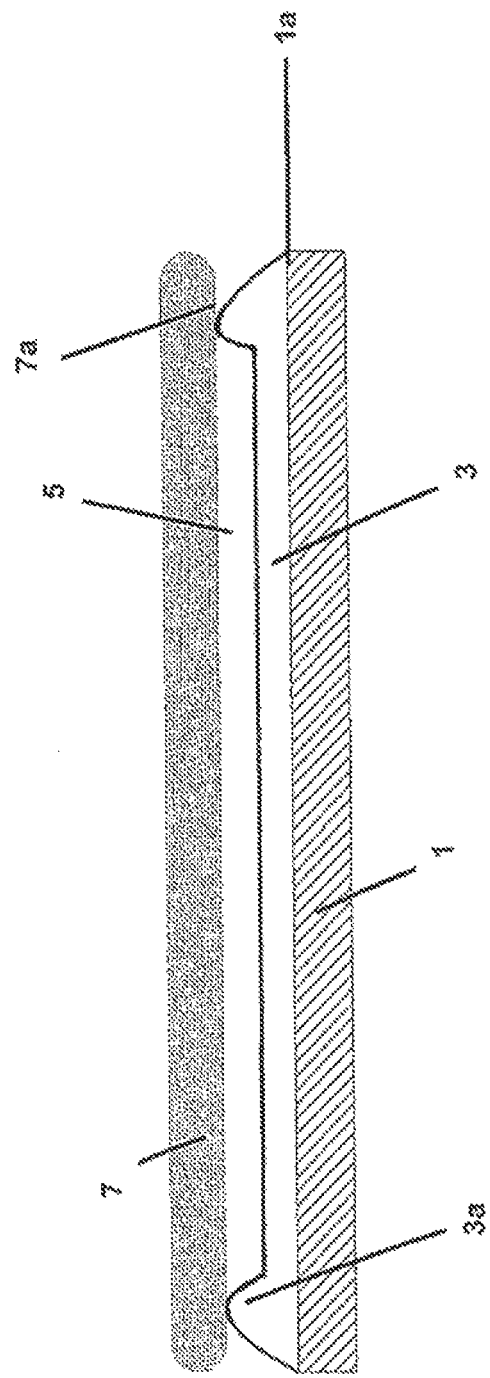

BONDING METHOD

CROSS-REFERENCE TO RELATED APPLICATIONS

This application is a §371 national stage entry of International Application No. PCT/EP2009/066058, filed Nov. 30, 2009, which claims priority to German Patent Application No. DE 10 2008 044 200.3, filed Nov. 28, 2008, the entire contents of which are incorporated herein by reference.

FIELD OF THE INVENTION

The invention relates to a method for bonding (joining) a first surface and a second surface by means of an interlayer, the material for the interlayer in a flowable state forming a bulge and the positive characteristics of said interlayer being utilized for bonding.

BACKGROUND OF THE INVENTION

The joining of surfaces plays a part in many uses. Thus, for example, layers are laminated in composite systems or protective films are applied to surfaces which are to be protected. For many uses such as in wafer processing for the semiconductor industry, it is crucial to achieve precision in bonding, for example when aligning the surfaces which are to be joined relative to one another or when setting the adhesive strength which exists after bonding.

Thus, with the objective of protecting wafers for subsequent processing steps, such as rear side metallization or thinning, protective layers and/or supporting layers are provided in the region of the side with the electronic components. The function of these layers is to stabilize the wafer to be processed and to protect it against mechanical stresses on the side to be protected. For this purpose, substrates which are configured as circular discs, such as a further wafer or a glass pane which stabilizes the wafer to be processed (also in the subsequently processed state, for example a thinned state) are often joined with the wafer to be processed by means of an interlayer. The interlayer can consist, for example of an adhesive or of polymeric material. Bonding is often carried out under mechanical pressure, for example, to ensure a positive interlocking and/or under the effect of heat to allow a join, for example, by means of a chemical change in the interlayer.

A method and device for bonding wafers are known, for example from AT 504 567 A2. In this case, the surfaces to be joined (bonded) are pressed against one another by means of pressure plates, with heat acting simultaneously or subsequently on the material to be bonded.

In this case, the expense and complexity of the apparatus is a problem and it is likewise difficult to ensure that in reality the pressure acts in a completely uniform manner over the entire surface. In addition, relatively high pressures are exerted on the items to be bonded, so that there is a high mechanical stress and furthermore, a thermal loading is necessary Comparable problems arise in the bonding methods known hitherto in the art.

SUMMARY OF THE INVENTION

The object of the invention was to provide a bonding method which ensures that pressure is exerted as uniformly as possible in the entire region of the surfaces to be bonded. Furthermore, the method should be capable of allowing the highest possible parallelism of the surfaces to be bonded, without very complex and expensive apparatus.

This object is achieved by a method for bonding a first surface and a second surface by means of an interlayer, comprising the steps:
a) providing a first item which has the first surface,
b) providing flowable, solidifiable material for the interlayer,
c) providing a second item which has the second surface,
d) applying the material for the interlayer onto the first surface so that a bulge encircling the surface is produced,
e) applying a vacuum around the first item and the second item,
f) bringing the second surface of the second item into contact with the circumferential bulge so that a sealed-off cavity is produced,
g) increasing the ambient pressure so that the cavity is eliminated (in other words, so that the volume of the cavity approaches zero, preferably is completely eliminated) without resulting in a stream of gas flowing into the cavity and
h) increasing the viscosity of the material for the interlayer.

In the present context, a surface can also support structures. In particular, for example micro-electronic elements can be present as structures in the surface and significant elevations, such as bumps are also possible. Preferably, however, the first surface is not provided with structures and likewise the second surface is preferably not provided with structures in the region in which it is contacted by the circumferential bulge, i.e. both surfaces are substantially planar.

Within the meaning of this application, the term "flowable material" is understood as a material which is in a flowable state during application under the temperature and pressure conditions.

A solidifiable material within the meaning of this application is a material for which the viscosity can increase up to, if appropriate, complete solidification by a chemical reaction, preferably by polymerization or any other measure such as lowering the temperature (but in this case without a change of aggregate), or is a wax.

Within the meaning of this application, the term "a circumferential bulge" is understood as an elevated edge in the lateral region of the layer which was formed from the material for the interlayer after being applied to the first surface. In this respect, the elevation is to be understood as being vertical to the plane of the first surface. In this context, "circumferential" means that the entire peripheral region of the layer is affected, i.e. a peripherally closed bulge is present.

Within the meaning of this application, a sealed-off cavity is a cavity in which gas is not exchanged with the surroundings.

Within the meaning of this application, a vacuum is a technical vacuum with a maximum pressure of preferably 100, preferably 50, more preferably 10, particularly preferably 1 and most particularly preferably 0.2 mbar. Within the meaning of this application, the term "ambient pressure" is understood as meaning a pressure which acts substantially uniformly over the entire system to be bonded. In particular, "ambient pressure" is understood as meaning atmospheric pressure.

For the method according to the invention, it is expedient to align the first surface parallel to the earth's surface. The material for the interlayer can be applied by a number of application methods.

Preferred methods for applying the material for the interlayer are doctoring, spraying, in particular spray coating, application by precipitation from suspension and in particular spin coating.

When spin coating (centrifugally casting) the material for the interlayer, which method is particularly preferred, this material is applied onto the substrate by a suitable means and, during the procedure or subsequently, the substrate is rotated such that the arising centrifugal forces drive the material from the center to the edge of the substrate and thus distribute it in a planar manner. This method is preferably carried out such that the material for the interlayer is applied in a highly uniform thickness over the first surface. It is also possible by this method to even out certain superficial unevennesses of the first surface, since the material for the interlayer is flowable. In this connection, it is easily possible for a person skilled in the art to select the material for the interlayer such that it has wetting characteristics with respect to the first surface, which result in the formation of a circumferential bulge (a so-called edge bead) in the peripheral region of the layer of the material for the interlayer. In this region, the layer thickness of the material for the interlayer is increased. Although this is usually undesirable, surprisingly in the method according to the invention it can be utilized in an advantageous manner.

It is of course clear to a person skilled in the art that the material for the interlayer can also be a mixture of several materials. However, the ability is important to make a substantially planar surface via the flowability, naturally with the exception of the circumferential bulge which is explicitly desired.

After the material for the interlayer has been applied to the first surface, the first item and the second item are introduced into a vacuum. Usually, this is carried out in that the items are introduced into a vacuum chamber which is evacuated accordingly. Of course, it is also possible where there is an appropriate configuration of the apparatus to carry out step d) under vacuum. This can be preferred for some uses.

To bond the first surface and the second surface, the second surface is brought into contact with the circumferential bulge under vacuum such that a sealed-off cavity is produced. For this purpose, it is of course sensible for the second surface to be aligned parallel to the first surface before contact with the bulge. In particular, if the surfaces are the same size and the same shape, it is of course sensible before the second surface contacts the circumferential bulge, to position said second surface such that it is laterally in line with the first surface. Of course, this aligning procedure can also be carried out before the vacuum is applied.

When the second surface is brought into contact with the circumferential bulge, it is particularly important for the bulge to contact the second surface over its entire circumference. The desired cavity is thus produced between the wafer surface and the substrate.

To ensure this, it is often preferred for the viscosity of the material for the interlayer to be so high that the circumferential bulge supports the first item such that a cavity remains. This can be achieved, for example in that the viscosity of the material over the interlayer is increased after application by suitable measures such as heating, irradiation etc. (depending on the material for the interlayer) if this does not suffice in supporting the second item without the circumferential bulge being leveled. However, as an alternative or in addition, it is also possible for the second item to be held in position by a suitable device so that its weight does not act fully on the circumferential bulge.

In this connection, it is pointed out that it can be advantageous for the use if the second surface is substantially planar. However, this is not absolutely necessary, since the viscosity of the material for the interlayer can be adjusted such that unevennesses of the second surface can be absorbed by the material for the interlayer. This means that structures in the second surface can sink into the material of the interlayer even when the second item contacts the circumferential bulge over its entire periphery. In this case, it is possible for several separate cavities to appear, but this does not restrict the advantages of the invention. The crucial factor, as indicated above, is that the circumferential bulge is in full contact with the second surface. Of course, this is ensured particularly effectively if the second surface is substantially planar in the contact region with the circumferential bulge.

To effect the contacting in step f), a person skilled in the art has a number of possibilities at his disposal. In this respect, for example the second item can be lowered by a suitable device until sufficient contact is provided. Alternatively, it is of course also possible for the first item to be raised. However, it is preferable for the second item to be brought close to the circumferential bulge in that it is arranged, for example $\leq 6$ mm, preferably $\leq 4$ mm, more preferably $\leq 1$ mm vertically above the bulge and, if appropriate, aligned laterally. Thereafter, it can be dropped. In this respect, it is possible for a person skilled in the art to adjust the height of fall on in the desired pressure exertion on the circumferential bulge. This he will do governed by the viscosity, present at the time of the drop, of the flowable solidifiable material.

After the contacting in step f), the ambient pressure is increased, for example by ventilating the vacuum apparatus. As a result, there is an ideal uniform pressure exertion on the arrangement consisting of first item, interlayer and second item. In this connection, it is preferable for the pressure to be increased up to a normal atmospheric pressure. Of course, care should be taken here that gas from the surroundings cannot enter the sealed-off cavity. The pressure is increased, for example by ventilation, but does not have to be increased up to atmospheric pressure.

Ventilation is carried out such that the increased ambient pressure causes the sealed-off cavity to be completely compressed. This means that the second surface forms with the material for the interlayer a positive interlocking. Possible unevennesses of the first surface and of the second surface as well as of the interlayer, due to the application, are compensated in this way by the flowability of the material of the interlayer. At the same time, the circumferential bulge is also leveled. Should there be any excess material of the bulge and possibly also of the further interlayer, this is preferably pressed out at the edge. However, in a borderline case, the cavity can also disappear when the upper surface is applied. As long as the circumferential bulge mutually seals both surfaces, the contact pressure force will act uniformly on the surfaces due to the increase in the external pressure.

The increase in the ambient pressure ensures an ideally uniform contact pressure between the first and second surfaces, facilitated by the interlayer. The alignment of the two surfaces relative to one another remains unchanged (naturally with the exception of the vertical spatial direction) so that it is possible to achieve a high accuracy in respect of the parallelism of the surfaces to one another. Furthermore, the uniform transfer of pressure ensures that individual parts or regions of one of the two items are not pressed in to a greater extent than desired, as can happen, for example when chucks or other punch-like pressure transferring devices are used.

In order to reduce the cost and complexity of the apparatus, as an alternative the method can also be carried out, for example, under atmospheric pressure. In this case, a vacuum would not be applied, neither would the ambient pressure be increased. However, it is naturally preferable to carry out the method under vacuum in order to prevent the inclusion of gas. In both cases, with and without vacuum, the cavity can also be eliminated by compressing the surfaces in another manner, for example using pressure plates or chucks. It can also be carried out simply by means of gravity. Accordingly, the compression using means other than atmospheric pressure is also part of the invention. Here as well, the prerequisite is that a stable sealed-off cavity is initially produced. It is assumed, however, that if the cavity is eliminated by means other than an increase in the atmospheric pressure, concessions will have to be made in respect of the accuracy of the alignment of the surfaces relative to one another.

After the cavity has been eliminated, in step h) the viscosity of the material for the interlayer is increased, and if appropriate the interlayer is completely solidified. This is ensured by a procedure which depends on the material, for example by heating, UV radiation or by initiating a reaction of a two-component material. Material for the interlayer which has also issued can be removed before, or after, the viscosity is increased.

It is preferred according to the invention that the flowable, solidifiable material is a polymerizable material. Examples of such materials include waxes, adhesives, crosslinking plastics materials, for example polyimides.

A method according to the invention is particularly preferred in which the flowable, solidifiable material can be solidified or partially solidified to produce an elastomer. Solidification or partial solidification means in each case an increase in viscosity, if appropriate up to a point where a solid is present. Preferred materials which can be solidified into an elastomer include rubber, organic elastomers, silicone elastomers or the precursors thereof.

A method according to the invention is preferred in which the first item is a wafer or a glass pane and/or the second item is a wafer.

The wafers can preferably be silicon wafers which are optionally doped. Wafers consisting of AlSb, AlAs, AlN, AlP, BN, BP, BAs, GaSb, GaAs, GaN, GaP, InSb, InAs, InN, InP can also be preferred for many applications. Borosilicate glass or quartz glass is preferred as the glass pane.

As indicated above, a method is preferred according to the invention in which the force which causes the contacting in step f) is gravity. In this case, as described, the second surface is brought close to the circumferential bulge and, if appropriate, is aligned laterally. The means holding the second item is then released or the holding force (such as an electrostatic force) is removed. As a result, the second item falls by gravity in an accelerated manner onto the circumferential bulge. The height of fall is adapted by a person skilled in the art such that a sealed-off cavity is produced and the circumferential bulge is preferably not completely leveled. An advantage of this preferred method is that the contacting procedure in step f) can be ensured at a low cost and complexity in terms of apparatus and with a high degree of accuracy.

Furthermore, a method is preferred according to the invention in which in step f) (if appropriate, concerning the weight of the second item) a maximum force of 100 Newton is exerted on the bulge, preferably a force of 10 N, more preferably a force of 1 N.

A method according to the invention is preferred in which the second item is a wafer with electronic components which are on the side of the wafer oriented towards the second surface or which form the second surface.

Within the meaning of the invention, the wafer can of course also comprise further layers, such as passivation layers on the electronic components.

In a particularly preferred embodiment of the invention, the second surface is formed by a passivation layer or a separation layer.

Preferred for the separation layer are plasmapolymeric layers which are possibly configured as gradient layers. This separation layer makes it possible to adjust the desired adhesion in a particularly advantageous manner. Suitable separation layers are described in WO 2007/099146 which, by way of reference, is included in its entirety as an integral part of this application. Particularly included as an integral part of this application are the details which describe the configuration of the separation layer. Also included by way of reference as an integral part of this application is WO 2004/051708 which likewise contains details about suitable separation layers. These details in particular are included by way of reference as an integral part of this application.

Furthermore, details about the configuration of the interlayer as an elastomer layer are also found in WO 2007/099146, these details also being explicitly included by way of reference as an integral part of this application.

A method according to the invention is preferred in which the separation layer is configured such that after the interlayer has cured, the separation layer adheres more firmly to said interlayer than to the wafer.

The adhesion between the respective layers can be determined by a person skilled in the art according to DIN 971-1: 1996-09 and it is defined there as "All the bond strengths between a coating and the substrate thereof."

In the following, the invention will be described by way of example with reference to a FIGURE and an example, both serving to provide a more detailed description of the invention, without restricting it.

FIG. 1 shows a first item 1 which has a first surface 1a which, in the following example, corresponds to a glass pane. The material for the interlayer 3 has been applied to the surface 1a such that a circumferential bulge 3a is produced. A second item 7 which has a second surface 7a has been positioned on this circumferential bulge 3a such that a sealed-off cavity 5 is produced. In the following example, the second item 7 corresponds to a silicon wafer, on the front side of which electronic structures have been applied, and said second item 7 also comprises a separation layer which forms the second surface 7a.

EXAMPLE

A 6" silicon wafer, on the front side of which the electrical structures have already been applied and are protected by a nitride protective layer (passivation) is to be prepared in order to reduce its original thickness of approximately 750 μm to a thickness of 50 μm. With a remaining thickness of 50μ, the wafer loses its inherent mechanical stability and becomes very fragile. As a result, there is a great risk of the wafer breaking, and to prevent this, the wafer is to be temporarily reinforced by a substrate such that even in a thinned state, it substantially has the mechanical strength of an un-thinned wafer. For this purpose, the substrate is bonded to the front side of the wafer, thus to the structured side thereof. The opposite side of the wafer is to be ground to thin it.

To prepare for bonding with the substrate, a plasmapolymeric separation layer is applied by PECVD to the front side of the wafer to be thinned which is to allow the substrate to be removed again later on. This procedure is described in WO 2007/099146, for example.

The substrate consists of a glass pane, although alternatively it is also possible to use a silicon wafer here which corresponds in diameter to the wafer to be thinned or is 1-2 mm larger. A liquid and not yet crosslinked silicone elastomer having a viscosity of 500 mPas is applied to this glass pane by spin coating. In this respect, the glass pane is introduced into an installation and fixed to a holding means. This holding means is rotated by a motor, it being possible to control the number of revolutions per minute.

The glass pane is initially brought to 300 rpm. On reaching this speed, a nozzle is used to apply a quantity of 10 ml of the elastomer exactly onto the center of the rotating glass pane. The elastomer is then forced to the edge of the glass pane by the centrifugal force derived from the rotational speed. With a viscosity of, for example 500 mPas, the elastomer is sufficiently flowable to wet the entire surface of the glass pane. To promote this action, the rotational speed can also be increased from 300 to, for example, 1000 rpm for a short period of time. By a suitable choice of product characteristics of the elastomer (for example viscosity) and by adjusting the process parameters (rotational speed, duration etc.), this process can be adjusted such that a coating is produced over the entire surface of the glass pane, which coating can be reproduced in its thickness tolerance within 10 µm, for example and has an absolute thickness of 150 µm.

The material cast on by centrifugation forms a circumferential bulge on the edge of the glass pane. This bulge is approximately 50 µm high and 1-2 mm wide.

To then join together the wafer and the substrate which is in the form of the elastomer-coated glass pane, the wafer and substrate are introduced into an installation which has a chamber which can be put under a vacuum.

First of all, the glass pane is fixed such that the coated side thereof faces upwards. Thereafter, the wafer to be thinned is positioned with the structured side downwards approximately 4 mm above the glass pane such that wafer and glass pane are in line with one another laterally. In this respect, the wafer is positioned laterally and held by small supports.

After the wafer and substrate have been fixed in the installation, the chamber enclosing them is put under vacuum by evacuation, the vacuum corresponding to 0.1 mbar. After this vacuum has been attained, the holding means of the wafer are removed so that the wafer falls and comes to rest on the coated glass pane. Due to the circular bulge on the edge of the glass pane, the wafer initially rests only on the elevation of the bulge. Thus a vacuum-filled empty space is formed between the wafer and substrate. As a result of the subsequent ventilation of the chamber, atmospheric pressure bears down on this empty space. Consequently, the empty space is compressed, as are the wafer and substrate. Due to the resulting pressure and the inherent stability of the glass pane, the elastomeric bulge is also compressed so that a positive interlocking is produced.

Thereafter, the elastomer is crosslinked in that the holding means on which the glass pane rests, is heated. It is possible to achieve different degrees of crosslinking as a result of purposefully adjusting the temperature and time. Thereafter, the resulting composite structure of wafer and substrate can be removed from the installation. An exact parallelism of the alignment of wafer and substrate is achieved.

The invention claimed is:

1. A method for bonding a first surface and a second surface by means of an interlayer, comprising the steps:

a) providing a first item which has the first surface,
b) providing flowable, solidifiable material for the interlayer,
c) providing a second item which has the second surface,
d) applying the material for the interlayer onto the first surface so that a circumferential bulge encircling the first surface is produced, wherein the interlayer is distributed from a center to an outside edge of the first surface and the circumferential bulge is an elevated area along the outside edge of the first surface,
e) applying a vacuum around the first item and the second item,
f) bringing the second surface of the second item into contact with the circumferential bulge so that a sealed-off cavity is produced,
g) increasing the ambient pressure so that the cavity is eliminated without resulting in a stream of gas flowing into the cavity and
h) increasing the viscosity of the material for the interlayer.

2. The method as claimed in claim 1, wherein the second item is a water with electronic components which are on the side of the wafer oriented towards the second surface or they form this second surface.

3. The method as claimed in claim 2, wherein the second surface is formed by a passivation layer or a separation layer.

4. The method as claimed in claim 3, wherein the second surface is formed by the separation layer and the separation layer is a plasmapolymeric layer.

5. The method as claimed in claim 3, wherein the second surface is formed by the separation layer and the separation layer is configured such that after the interlayer has cured, the separation layer adheres more firmly to the interlayer than to the wafer.

6. The method as claimed in claim 1, wherein the bulge is an elevated edge in a lateral region of the layer which was formed from the material for the interlayer after being applied to the first surface.

7. The method as claimed in claim 6, wherein the interlayer completely covers the first surface.

8. The method as claimed in claim 1, wherein the flowable, solidifiable material is a polymerizable material.

9. The method as claimed in claim 1, wherein the flowable, solidifiable material can be solidified to produce an elastomer.

10. The method as claimed in claim 1, wherein the first item is a wafer or a glass pane and/or the second item is a wafer.

11. The method as claimed in claim 1, wherein the force causing the contacting in step f) is gravity.

12. The method as claimed in claim 1, wherein in step f), a maximum force of 100 N is exerted on the bulge in addition to the weight of the second item.

13. The method as claimed in claim 1, wherein the interlayer completely covers the first surface.

14. The method as claimed in claim 1, wherein applying the material for the interlayer onto the first surface so that the circumferential bulge encircling the surface is produced is done at a peripheral region of the first surface.

* * * * *

UNITED STATES PATENT AND TRADEMARK OFFICE
CERTIFICATE OF CORRECTION

PATENT NO.         : 8,641,859 B2
APPLICATION NO.    : 13/131756
DATED              : February 4, 2014
INVENTOR(S)        : Franz Richter Page 1 of 1

It is certified that error appears in the above-identified patent and that said Letters Patent is hereby corrected as shown below:

In the Claims

In Column 8, line 21 of Claim 2 reads "item is a water with electronic components which are on the" but should read "item is a wafer with electronic components which are on the"

Signed and Sealed this
Twenty-second Day of September, 2015

Michelle K. Lee
*Director of the United States Patent and Trademark Office*